(12) United States Patent
Chung et al.

(10) Patent No.: US 7,562,450 B2
(45) Date of Patent: Jul. 21, 2009

(54) METHODS FOR DESIGNING SINGLE-LOBE ROTORS

(75) Inventors: Tien-Tung Chung, Taipei Hsien (TW); Heng-I Lin, Taipei Hsien (TW)

(73) Assignee: Liung Feng Industrial Co., Ltd., Taipei Hsien (TW)

( * ) Notice: Subject to any disclaimer, the term of this patent is extended or adjusted under 35 U.S.C. 154(b) by 746 days.

(21) Appl. No.: 11/338,662

(22) Filed: Jan. 25, 2006

(65) Prior Publication Data

US 2007/0050065 A1 Mar. 1, 2007

Related U.S. Application Data

(63) Continuation-in-part of application No. 11/214,876, filed on Aug. 31, 2005, now Pat. No. 7,255,545.

(51) Int. Cl.
*B21D 53/78* (2006.01)
*F02B 53/04* (2006.01)
*F01C 21/10* (2006.01)
*F01C 1/16* (2006.01)
*F01C 1/18* (2006.01)
*G06F 17/50* (2006.01)
*G06F 7/60* (2006.01)

(52) U.S. Cl. .......................... 29/889; 123/218; 418/150; 418/201.3; 418/206.5; 703/1; 703/2

(58) Field of Classification Search .................. 29/889; 123/200, 218; 418/150, 201.3, 206.5, 61.2; 703/1, 2
See application file for complete search history.

(56) References Cited

U.S. PATENT DOCUMENTS 6,776,594 B1 * 8/2004 Heng-I et al. ............ 418/206.5

* cited by examiner

*Primary Examiner*—David P Bryant
*Assistant Examiner*—Alexander P Taousakis
(74) *Attorney, Agent, or Firm*—Rosenberg, Klein & Lee

(57) ABSTRACT

The present invention provides a method for designing single-lobe rotors of the present invention includes: curve portions of the of a curve E, an arc A, an arc B, an arc F, an arc C, an arc H, a straight line Y, and an arc G, wherein a center of the arc H located in line with a center of the arc C through a center of the defined rotor, and a center of the arc G is same as the center of the defined rotor wherein a radius of the arc G is defined between a center of the arc G and an end point of the arc H, from which two end points of the arc G is smoothly connected with the arc H and the arc C. The single-lobe rotors generated by the method is able to provide higher compression ratio and larger discharge capacity, secure a smooth process while working chamber undergoing compression and expansion, and reduce leakage.

2 Claims, 4 Drawing Sheets

METHODS FOR DESIGNING SINGLE-LOBE ROTORS

REFERENCE TO RELATED APPLICATIONS

This application is a continuation-in-part application of U.S. patent application Ser. No. 11/214,876 filed Aug. 31, 2005 now U.S. Pat. No. 7,255,545, the entire contents of the above mentioned application being incorporated herein by reference.

BACKGROUND OF THE INVENTION

1. Field of the Invention

The present invention relates to methods for designing single-lobe rotors. By setting suitable parameters, the methods can profile a single-lobe of a defined rotor and a conjugate rotor which intermesh and conjugate to each other, and effectively evaluate optimum performance in intermeshing and conjugating, whereby to provide higher compression ratio and larger discharge capacity, secure a smooth process while working chamber undergoing compression and expansion, and reduce leakage, thus can reduce noise and vibration while operation of the rotors.

2. Related Art

A large variety of related rotor mechanism are already known, see for example U.S. Pat. Nos. 1,426,820, 4,138,848, 4,224,016, 4,324,538, 4,406,601, 4,430,050 and 5,149,256. Rotors of the prior arts have drawbacks that curves of each lobe of the rotors are not continuously and smoothly contacted at the joint between each segment; such drawbacks cause tips of the rotors do not mesh completely with other rotor when they are rotating. Consequently, in applying to machines working as periodical expansion and compression operation, the abnormal situations such as noise and vibration take place in working chamber enclosed by s defined rotor, conjugate rotor and inner walls of cylinder. Moreover, inappropriate intermeshing between the rotors increases wear and therefore reduces the durability of operation.

In view of aforesaid disadvantages, U.S. patent application Ser. No. 11/214,876 has disclosed a defined rotor and a conjugate rotor designed by variety of parameters. Such rotors can reduce noise and vibration as operation.

SUMMARY OF THE INVENTION

Accordingly, an object of the present invention is to provide a method for designing single-lobe rotors which is able to generate a defined rotor and a conjugate rotor intermeshing and conjugating to each other by different parameters. The rotors generated by way of the method can provide higher compression ratio and larger discharge capacity as apply to machines for periodical expansion and compression operation, secure a smooth process while working chamber undergoing compression and expansion, and which reduce leakage as well reduce noise and vibration.

To achieve the above-mentioned objects, the method for designing single-lobe rotors of the present invention includes: curve portions of a curve E, an arc A, an arc B, an arc F, an arc C, an arc H, a straight line Y, and an arc G, wherein a feature of the present invention is that a center t5 of the arc H is located in line with the center t4 of the arc C and is symmetrical to the center t4 of the arc C against the center t1, a radius $r_C$ of the center t5 is as same as of the arc C, an end point P8 of the arc H is vertically located above the center t5 and another end point P9 of the arc H is located in line with the point P6 through the center t5, t1 and t4, namely, the center t5 and the point P9 are respectively symmetrical to the center t4 and the point P6 against the center t1.

Moreover, another feature of the present invention is that a center of the arc G is the same center t1, and a radius thereof is between the center t1 and the point P9 such that the arc G is profiled from the point P9 to a point P5 of the arc C, whereby the arc G is smoothly connected with the arc H and the arc C.

DESCRIPTION OF THE PREFERRED EMBODIMENTS

Figure 1:
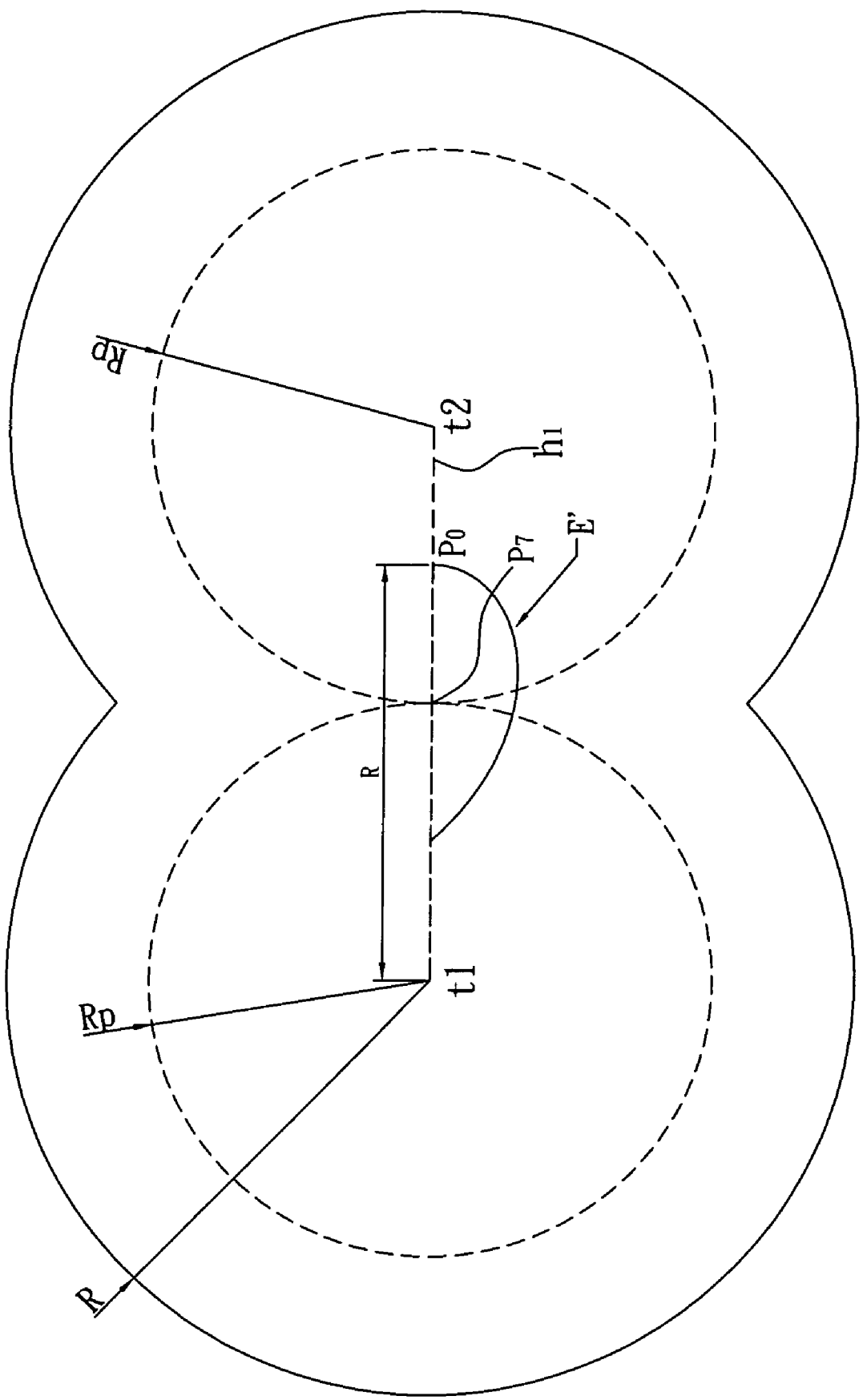
FIG. 1 is a schematic view of forming a tip conjugate curve by a method for designing single-lobe rotors of the present invention.
Figure 2:
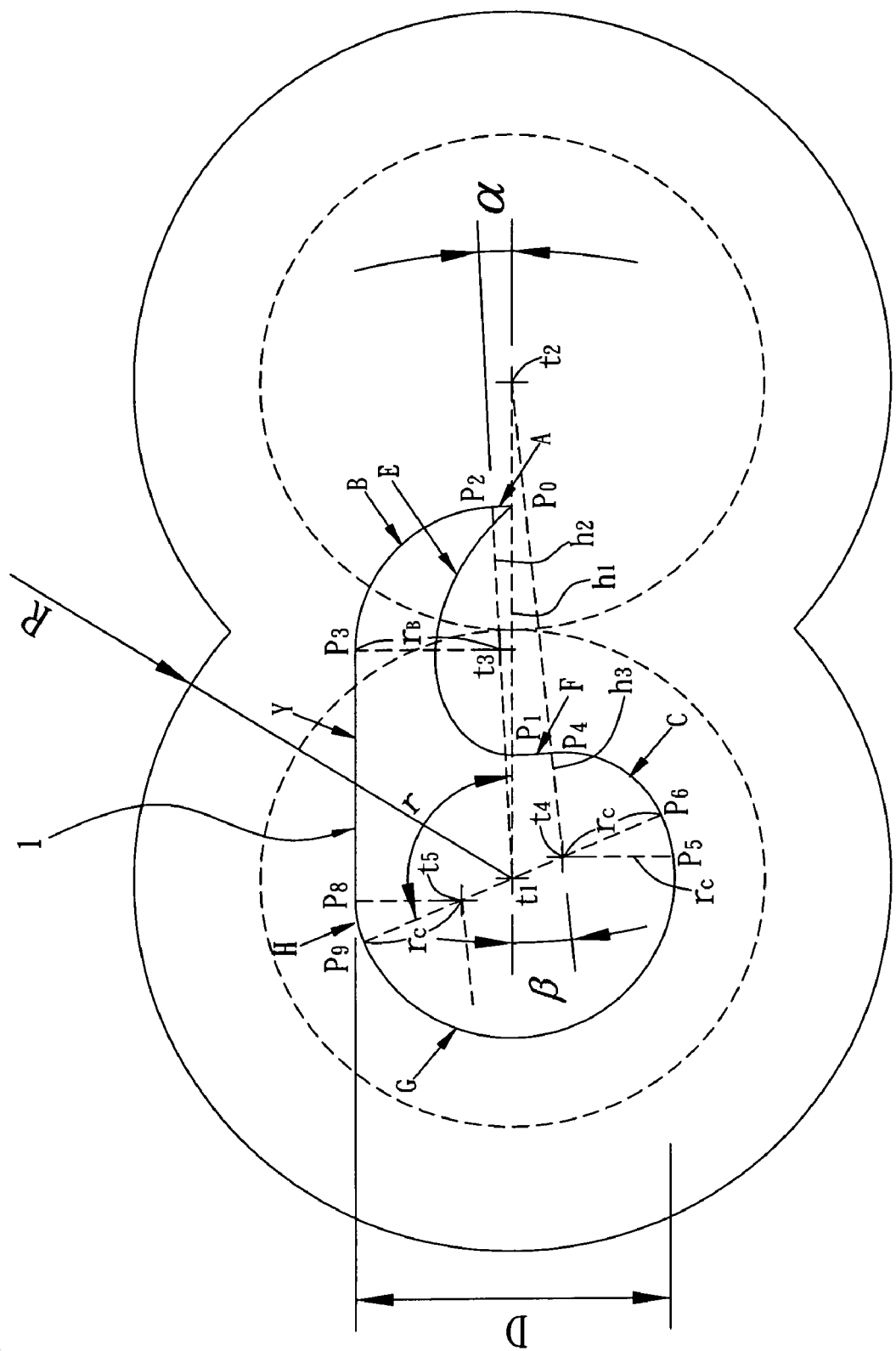
FIG. 2 is a schematic view of forming a single-lobe profile of a defined rotor by the method of the present invention.
Figure 3:
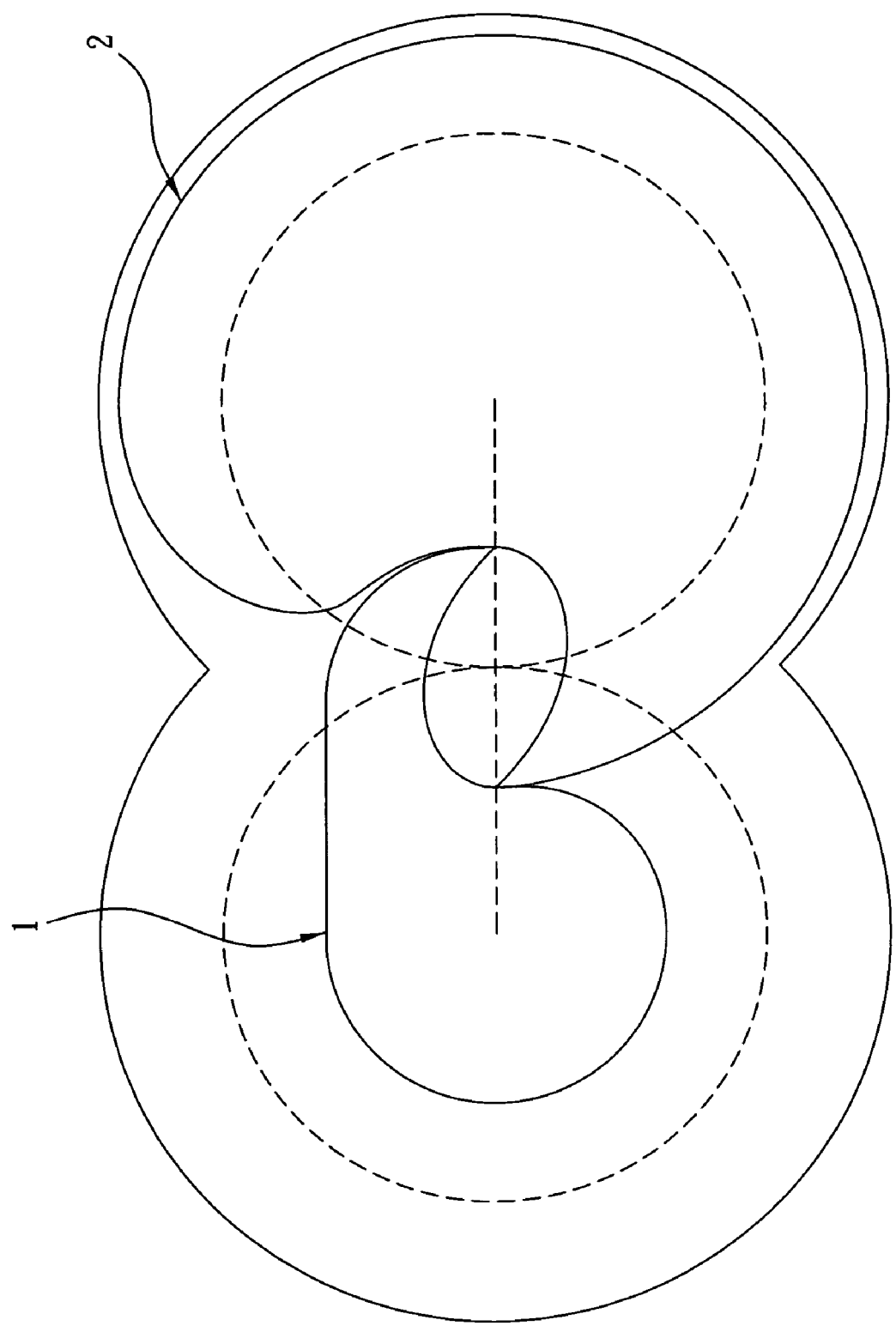
FIG. 3 is a schematic view of forming a single-lobe profile of a conjugate rotor by the method of the present invention.

A single-lobe rotor design process in accordance with the present invention is adapted for designing curve portion of a defined rotor 1 by suitable parameters, and then get the curve portion of a conjugate rotor 2 with conjugate theory. Referring to FIGS. 1 to 3, designing process for forming the curve portion of the defined rotor 1 comprises the following steps:

1. Designate a maximum radius R and a width D of the defined rotor 1, a pitch circle radius Rp of the defined and the conjugate rotor 1, 2, a first center t1 of the defined rotor 1 and a second center t2 of the conjugate rotor 2, wherein R=60 mm, D=50 mm, Rp=40 mm, the pitch circle radius Rp is smaller than radius R, and R and Rp are in appropriate ratio R=3 Rp/2.

2. Referring to FIG. 1, define a reference horizontal line h1 by straight connecting the first center t1 and the second center t2, a base point P0 located on the reference horizontal line h1 and being offset from the first center t1 in a length same as the radius R, a conjugate curve E' generated as the base point P0 rotating around the first center t1, a curve E generated by symmetrically imaging the conjugate curve E' against a tangent point P7 of the two pitch circles of the defined and the conjugate rotor 1, 2, and a first point P1 located in an intersection of the curve E and the horizontal line h1.

3. Referring to FIG. 2, designate a second point P2 which is located by drawing around the first center t1 with the radius R from the point P0 at a central angle α (α is 3°), whereby an arc A is generated between the point P0 and P2, and is smoothly connected to the curve E.

4. Define a second line h2 by straight connecting the first center t1 and the second point P2 and further designating a third center t3 thereon, of which a radius is $r_B$.

5. The radius $r_B$ is defined by following equation:

$$r_B + (R - r_B)\sin\alpha = \frac{D}{2}$$

$$r_B = \frac{D/2 - r\sin\alpha}{1 - \sin\alpha}$$

(wherein R is the maximum radius of the defined rotor 1, that is, a length between the first center t1 and the second point P2)

6. defining an arc B by drawing around the third center t3 with the radius $r_B$ from the second point P2 to a third point P3, wherein the third point P3 is vertically located above the third center t3;
7. defining an arc F by drawing around the second center t2 with the maximum radius R from the point P1 to a fourth point P4 wherein the fourth point P4 is located below the point P1 and made an central angle of β (β is 6°) with the horizontal line h1;
8. defining a third line h3 by straight connecting the center t2 and the fourth point p4, and a radius $r_C$ being computed by following equation:

$$r_C + (r + r_C)\sin\beta = \frac{D}{2}$$
$$r_C = \frac{D/2 - r\sin\beta}{1 + \sin\beta}$$

9. designating a center t4 located in a straight extension direction of the third line h3 and spaced from the fourth point P4 with a distance of the radius $r_C$;
10. defining an arc C by drawing around the center t4 with the radius $r_C$ from the fourth point P4 to a fifth point P5 wherein the fifth point P5 is vertically located under the center t4;
11. designating a sixth point P6 located on the arc C and being in straight line with the center t1 through the center t4, a center t5 of an arc H located in line with the center t4 through the center t1 and being symmetrical to the center t4 of the arc C against the center t1, a radius of the center t5 defined as same as the radius $r_C$ of the arc C, an eighth point P8 vertically located above the center t5 and spaced from the center t5 with a same distance of the radius $r_C$;
12. defining an straight line Y by straight connecting the point P3 and P8;
13. defining the arc H by drawing around the center t5 with the radius $r_C$ from the point P8 to a ninth point P9 wherein the point P9 located in line with the center t1 through the center t5, and therefore being in straight line with the point P6 and being symmetrical to the point P6 against the center t1;
14. Finally, defining an arc G by drawing around the center t1 from the point P9 to the point P5 with a radius of a length between the point P9 and the center t1, whereby the arc G is smoothly connected with the arc H and the arc C; accordingly, the curve portion of the single lobe of the defined rotor 1 is generated by linking the curve E, the arc A, the arc B, the arc F, the arc C, the straight line Y, the arc H, and the arc G.

Accordingly, the conjugate rotor 2 is formed through a conjugate curve portion profiled respectively from the curve portion of the single-lobe of the defined rotor 1 by using the above-described steps.

Figure 4:
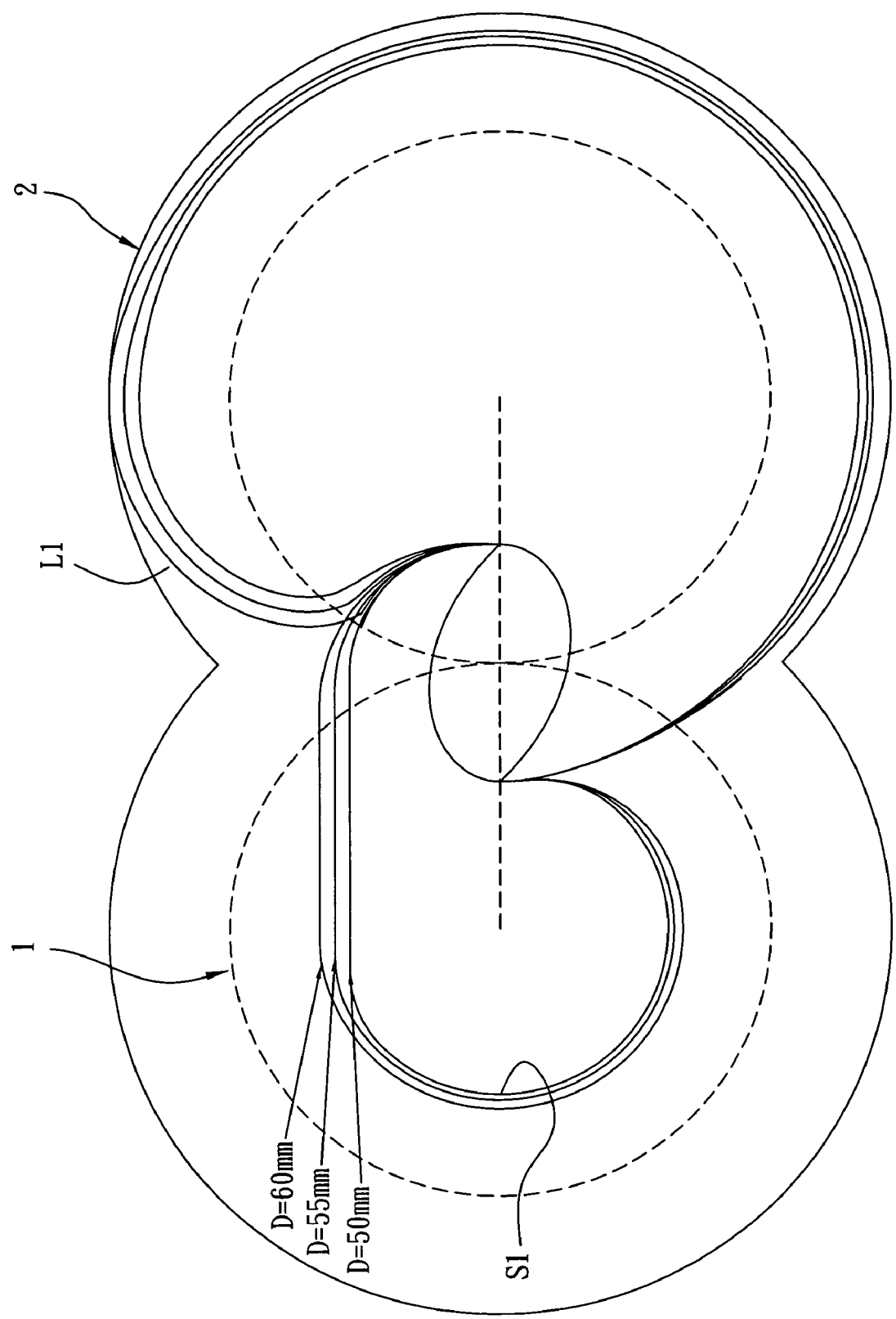
FIG. 4 is a schematic view of various combinations of the single-lobe defined rotor and conjugate rotor, wherein a width D thereof is 50, 55, 60 . . . mm, a central angle α is 3° and a central angel β is 6°.

Further referring to FIG. 4, which is a schematic view of various combinations of the single-lobe defined rotor 1 and conjugate rotor 2, wherein the maximum R of the defined rotor 1 is 60 mm, the pitch circle radius Rp is 40 mm, the width D is 50, 55, 60 mm, and the central angle α is 3°, the central angel β is 6°; as general characteristics of conjugate intermeshing between two rotors, the defined rotor 1 (S1) of the minimum width D corresponds to the conjugate rotor 2 (L1) of the maximum value. Accordingly, depending on practical applications, an appropriate size of the defined rotor 1 and the conjugate rotor 2 can be determined by analogy with aforesaid characteristics.

By setting suitable parameters, the method can profile the single-lobe defined rotor 1 and the conjugate rotor 2 which intermesh and conjugate to each other, and effectively evaluate optimum performance in intermeshing and conjugating, whereby to provide higher compression ratio and larger discharge capacity, secure a smooth process while working chamber undergoing compression and expansion, and reduce leakage.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method for designing single-lobe rotors adapted for generating a defined rotor and a conjugate rotor both having a single lobe intermeshing and conjugating to each other by way of appropriate parameters, comprising: curve portions of a single lobe of the defined rotor generated by a curve E, an arc A, an arc B, an arc F, an arc C, an arc H, and a straight line Y, then taking advantage of said curve portions of the defined rotor to generate conjugate curve portion for forming the conjugate rotor, wherein the method for designing a single lobe of the defined rotor comprising:

designating a maximum radius R of the defined rotor and a width D of the defined rotor, a pitch circle radius Rp of the defined rotor and the conjugate rotor, a first center t1 of the defined rotor and a second center t2 of the conjugate rotor, wherein a distance between the first center t1 and the second center t2 is 2 Rp, the pitch circle radius Rp is smaller than radius R, and R and Rp are in appropriate ratio in length;

defining a reference horizontal line h1 by straight connecting the first center t1 and the second center t2, a base point P0 located on the reference horizontal line h1 and being offset from the first center t1 in a length same as the radius R, a conjugate curve E' generated as the base point P0 rotating around the first center t1, a curve E generated by symmetrically imaging the conjugate curve E' against a tangent point P7 of the two pitch circles of the defined rotor and the conjugate rotor, therefore a first point P1 located in an intersection of the curve E and the horizontal line h1;

designating a second point P2 located by drawing around the first center t1 with the radius R from the point P0 at an central angle α, thereby an arc A generated by connecting the point P0 and P2 and smoothly connected to the curve E;

defining a second line h2 by straight connecting the first center t1 and the second point P2, and further designating a third center t3 thereon and a radius $r_B$ of the third center t3 wherein the radius $r_B$ is defined by following equation:

$$r_B + (R - r_B)\sin\alpha = \frac{D}{2}$$
$$r_B = \frac{D/2 - r\sin\alpha}{1 - \sin\alpha}$$

defining an arc B by drawing around the third center t3 with the radius $r_B$ from the second point P2 to a third point P3, wherein the third point P3 is vertically located above the third center t3;

defining an arc F by drawing around the second center t2 with the radius R from the first point P1 to a fourth point P4 wherein the fourth point P4 is located below the first point P1 and made an angle of β to the horizontal line h1;

defining a third line h3 by straight connecting the center t2 and the fourth point p4, and a radius $r_C$ being computed by following equation:

$$r_C + (r + r_C)\sin\beta = \frac{D}{2}$$

$$r_C = \frac{D/2 - r\sin\beta}{1 + \sin\beta}$$

designating a center t4 located in a straight extension direction of the third line h3 and spaced from the fourth point P4 with a distance of the radius $r_C$;

defining an arc C by drawing around the center t4 with the radius $r_C$ from the fourth point P4 to a fifth point P5 wherein the fifth point P5 is vertically located under the center t4;

designating a sixth point P6 located on the arc C and being in straight line with the center t1 through the center t4, a center t5 located in line with the center t4 through the center t1 and being symmetrical to the center t4 of the arc C against the center t1, and a radius of the center t5 defined as same as the radius $r_C$ of the arc C, an eighth point P8 vertically located above the center t5 and spaced from the center t5 with a same distance of the radius $r_C$;

defining an straight line Y by straight connecting the point P3 and P8;

defining an arc H by drawing around the center t5 with the radius $r_C$ from the point P8 to a point P9 wherein the point P9 located in line with the center t1 through the center t5, and therefore being in straight line with the point P6 and being symmetrical to the point P6 against the center t1;

defining an arc G by drawing around the center t1 from the point P9 to the point P5 with a radius of a length between the point P9 and the center t1, whereby the arc G is smoothly connected with the arc H and the arc C;

generating the curve portion of the single lobe of the defined rotor by linking the curve E, the arc A, the arc B, the arc F, the arc C, the straight line Y, the arc H, and the arc G.

2. The method for designing single-lobe rotors, as claimed in claim 1, wherein the maximum radius R of the defined rotor and the pitch circle radius Rp are in a ratio R=3 Rp/2.

* * * * *